United States Patent
Speer

(10) Patent No.: US 9,721,819 B2
(45) Date of Patent: Aug. 1, 2017

(54) METHOD FOR MOUNTING SEMICONDUCTORS PROVIDED WITH BUMPS ON SUBSTRATE LOCATIONS OF A SUBSTRATE

(71) Applicant: Besi Switzerland AG, Cham (CH)

(72) Inventor: Florian Speer, Worgl (AT)

(73) Assignee: BESI SWITZERLAND AG, Cham (CH)

( * ) Notice: Subject to any disclaimer, the term of this patent is extended or adjusted under 35 U.S.C. 154(b) by 0 days.

(21) Appl. No.: 15/250,796

(22) Filed: Aug. 29, 2016

(65) Prior Publication Data

US 2017/0062257 A1   Mar. 2, 2017

(30) Foreign Application Priority Data

Aug. 31, 2015 (CH) .......................... 1248/15
Sep. 28, 2015 (CH) .......................... 1404/15

(51) Int. Cl.
| H01L 21/68 | (2006.01) |
| H01L 21/67 | (2006.01) |
| H01L 21/56 | (2006.01) |
| H01L 23/00 | (2006.01) |

(52) U.S. Cl.
CPC ............ *H01L 21/681* (2013.01); *H01L 21/56* (2013.01); *H01L 21/67144* (2013.01); *H01L 24/75* (2013.01); *H01L 24/81* (2013.01)

(58) Field of Classification Search
None
See application file for complete search history.

(56) References Cited

U.S. PATENT DOCUMENTS

| 5,372,294 | A | 12/1994 | Gore et al. |
| 8,166,637 | B2 | 5/2012 | Blessing et al. |
| 2007/0145102 | A1 | 6/2007 | Blessing et al. |
| 2009/0098667 | A1 | 4/2009 | Behler et al. |
| 2010/0257728 | A1 | 10/2010 | Hiraki |
| 2013/0133188 | A1 | 5/2013 | Suter et al. |
| 2016/0176045 | A1* | 6/2016 | Golda .................. B25J 15/0085 414/806 |
| 2016/0190088 | A1* | 6/2016 | Yu .......................... B32B 37/02 438/107 |
| 2016/0276205 | A1* | 9/2016 | Huska ..................... H01L 33/62 |

FOREIGN PATENT DOCUMENTS

| JP | 2009-259917 A | 11/2009 |
| WO | 2008/098861 A1 | 8/2008 |

* cited by examiner

*Primary Examiner* — Asok K Sarkar
(74) *Attorney, Agent, or Firm* — David B. Ritchie; CanaanLaw, P.C.

(57) ABSTRACT

The invention relates to a method for mounting semiconductor chips provided with bumps as flip chips on substrate locations of a substrate. The method comprises the placing of a flip chip in a cavity arranged in a stationary manner where the bumps are wetted with a fluxing agent and the position of the flip chip is determined by means of a camera. The method further comprises the use of a transport head and a bonding head, which allow rapid and highly precise mounting.

5 Claims, 2 Drawing Sheets

Figure 1:
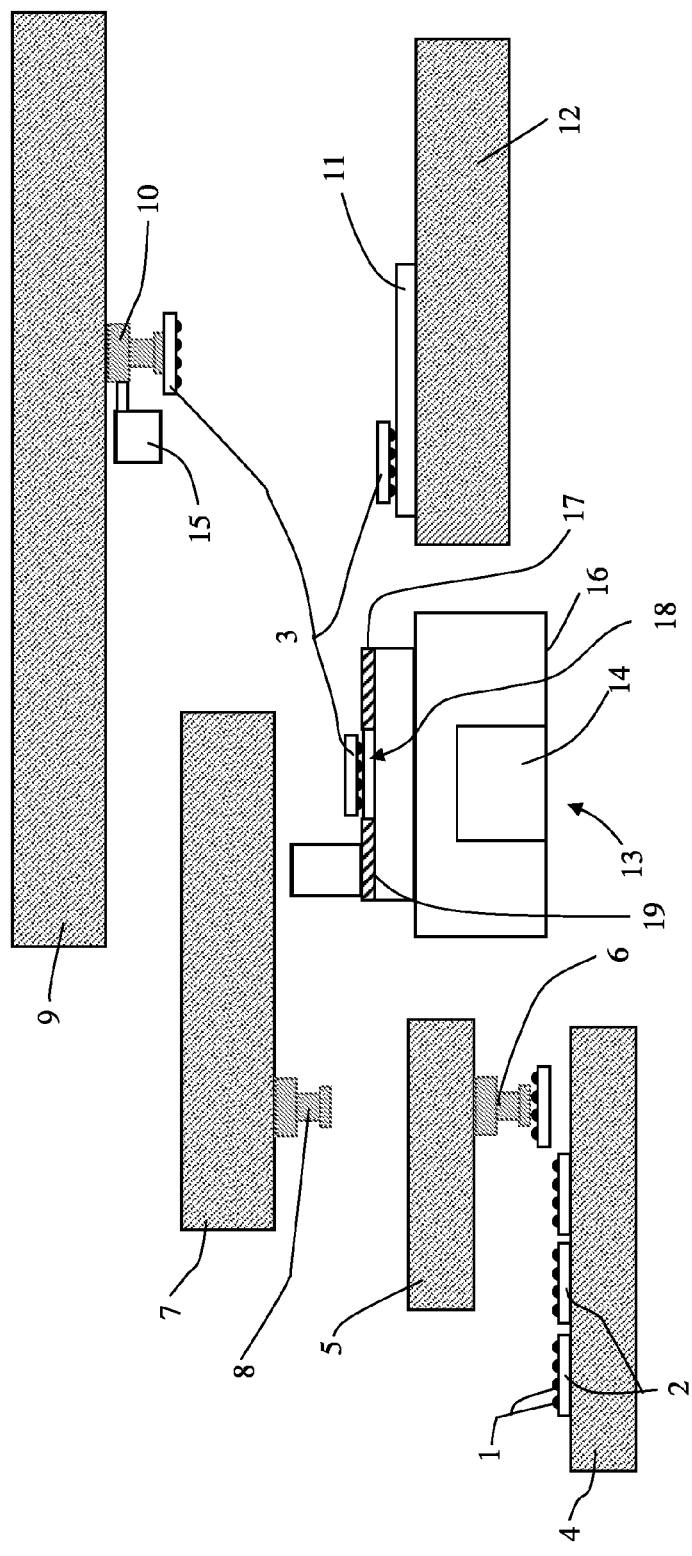

METHOD FOR MOUNTING SEMICONDUCTORS PROVIDED WITH BUMPS ON SUBSTRATE LOCATIONS OF A SUBSTRATE

PRIORITY CLAIM

Applicant hereby claims foreign priority under 35 U.S.C. §119 from Swiss Application No. 1248/15 filed Aug. 31, 2015 and from Swiss Application No. 1404/15 filed Sep. 28, 2015, the disclosures of which are herein incorporated by reference.

FIELD OF THE INVENTION

The invention relates to a method for mounting semiconductor chips provided with bumps as flip chips on substrate locations of a substrate.

BRIEF DESCRIPTION OF THE INVENTION

The invention is based on the object of developing a method for mounting semiconductors chips as flip chip on a substrate, which allows extremely high placement precision on the one hand and the highest possible throughput on the other hand.

BRIEF DESCRIPTION OF THE DRAWING FIGURES

Figure 2:
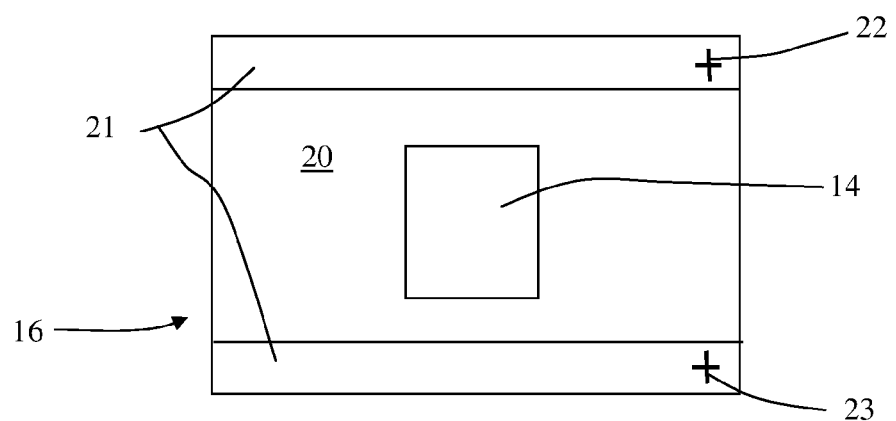
Figure 3:
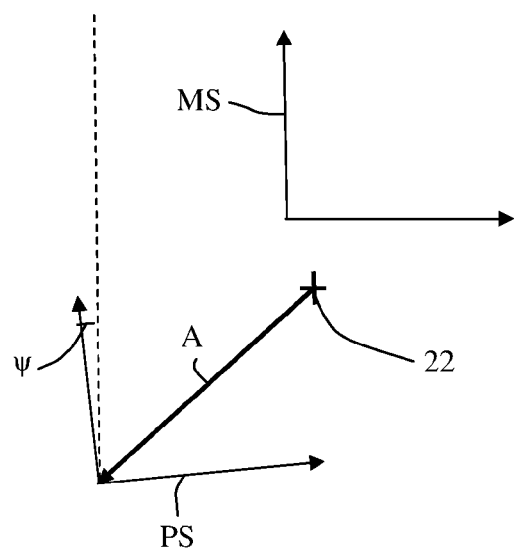

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 schematically shows a side view of an apparatus for mounting semiconductor chips provided with bumps as flip chip, FIG. 2 shows a camera support in a top view, and FIG. 3 shows a pixel coordinate system and a machine coordinate system.

DETAILED DESCRIPTION OF THE INVENTION

FIG. 1 schematically shows a side view of an apparatus for mounting semiconductor chips 2 provided with bumps 1 as a flip chip 3, which is set up for carrying out the method in accordance with the invention. The apparatus comprises a wafer table 4 for providing the semiconductor chips 2, a flip apparatus 5 with a pickup head 6, a first transport system 7 with a transport head 8, a second transport system 9 with a bonding head 10, a transport system (not shown) for supplying and providing substrates 11 on a support 12, a device 13 for wetting the semiconductor chips with a fluxing agent, a first camera 14 and a second camera 15. The device 13 comprises a camera support 16, a plate 17 with a cavity 18 whose base is transparent, and a downwardly open fluxing agent container 19. The position of the bonding head 10 is described by machine coordinates. The apparatus is controlled by a control device, which is not shown.

The first transport system 7 is set up to move the transport head 8 in at least two spatial directions. The second transport system 9 is set up to move the bonding head 10 in three spatial directions.

In another apparatus, which is also suitable for carrying out the method in accordance with the invention, the wafer table 4 and the flip apparatus 5 with the pickup head 6 are not present, but replaced by a feeding device (also known as feeder) which provides the semiconductor chips 2 directly as flip chips 3. In such an apparatus, the element shown in FIG. 1 with reference numeral 4 represents the feeding device.

The camera support 16 is arranged in a stationary manner on the apparatus and comprises a base 20, to which the first camera 14 is fastened, and at least two side walls 21. The plate 17 is detachably mounted on the camera support 16. FIG. 2 shows the camera support 16 in a top view. The camera support 16 comprises a first optical marking 22 and, optionally, at least one further optical marking 23. The camera support 16 is formed in a mechanically stiff manner in such a way that the first camera 14 and the optical marking(s) 22, and optionally 23, are in a rigid geometric relationship with respect to each other, so that the position and the orientation of the pixel coordinate system assigned to the images of the first camera 14 are in a fixed relationship (i.e. assumed to be non-changeable in this case) to the position of the optical marking(s) 22, and optionally 23.

The optical marking(s) 22, and optionally 23, are preferably arranged in a direction extending perpendicularly to the surface of the support 12 for the substrates 11 at a height which is substantially equal to the height of the substrate locations. This offers the advantage that the bonding head 10 is located substantially at the same height when the second camera 15 records an image of the optical marking(s) 22, and optionally 23, or an image of the substrate locations or an image of substrate markings of a substrate. This means that the bonding head 10 need not be lifted to different heights to bring the object to be photographed to the focusing plane of the second camera 15.

Pixel coordinates of the flip chip 3 are determined from the image of the flip chip 3 recorded by the first camera 14 and converted by means of first geometry data into machine coordinates of the bonding head 10. The first geometry data comprise the position of the first optical marking 22 and a vector A with fixed values (u, v), which designates the direction and distance of the first optical marking 22 from a reference point of the pixel coordinate system of the first camera 14. The first geometry data further comprise a fixed angle $\psi$, which describes the twisting between the pixel coordinate system of the first camera 14 and the machine coordinate system of the bonding head 10. If there is more than one optical marking, the first geometry data comprise the position of each further optical marking and an associated vector with fixed values, which designates the direction and distance of the further optical marking from the reference point of the pixel coordinate system of the first camera 14.

Die FIG. 3 schematically shows the machine coordinate system MS of the bonding head 10, the pixel coordinate system PS of the first camera 14, the first optical marking 22, the vector A and the angle $\psi$. The values (u, v) of the vector A are numbers in the machine coordinate system MS.

As will be explained below in closer detail, the flip chip 3 is deposited in the cavity 18 in the method in accordance with the invention, wherein its bumps 1 are immersed in the fluxing agent, an image is recorded with the first camera 14, and after the expiration of a wetting period the flip chip 3 is removed from the cavity 18 and mounted on the substrate 11. The cavity 18 is situated during this phase on a fixed location above the first camera 14 and the field of vision of the first camera 14 is directed to the base of the cavity 18, so that its image shows the bottom side of the flip chip 3 with the bumps 1.

In a first embodiment, the fluxing agent container 19 is arranged in a stationary manner. In this case, the device 13 comprises a drive for a reciprocating movement of the plate 17. The plate 17 is moved to such an extent for filling the cavity 18 with fluxing agent that the cavity 18 is situated beneath the fluxing agent container 19 or on the opposite side of the fluxing agent container 19, and is then moved back again so that the cavity 18 is situated at the aforementioned location above the first camera 14.

In a second embodiment, the plate 17 is arranged in a stationary manner, wherein the cavity 18 is located above the first camera 14. In this case, the device 13 comprises a drive for the movement of the fluxing agent container 19 from the one side of the cavity 18 to the opposite side of the cavity 18. The fluxing agent container 19 slides on the plate 17 and fills the cavity 18 with fluxing agent.

The second camera 15 is fastened to the bonding head 10. The optical axis of the camera 15 extends parallel to the gripping axis of the bonding head 10. The second camera 15 is mechanically fastened to the bonding head 10 in such a way that the orientation of the pixel coordinate system assigned to the images of the second camera 15 is in a fixed geometric relationship to the gripping axis of the bonding head 10. The pixel coordinates of the substrate location, which are determined by means of at least one image of the substrate location or markings on the substrate recorded by the second camera 14, are converted by means of second geometry data into machine coordinates of the bonding head 10.

The second geometry data comprise a vector B with values (x, y), which designates the direction and distance of a reference point of the pixel coordinate system of the second camera 15 from a reference point of the machine coordinate system of the bonding head 10. The second geometry data further comprise an angle φ, which describes the twisting of these two coordinate systems.

The first and the second geometry data further comprise scaling factors, which enable the conversion of values in the pixel coordinate system of the respective camera into values in the machine coordinate system of the bonding head 10. The first and second geometry data are determined in a calibration phase which is carried out before the mounting phase. The calibration phase can be carried out at different points in time in order to increase the long-term stability of the apparatus and the method.

The described embodiments of the apparatus are capable of carrying out the method in accordance with the invention for mounting semiconductor chips as flip chips on the substrate. The method in accordance with the invention comprises the aforementioned calibration phase on the one hand in which the first and the second geometry data are determined, and the mounting phase in which the following steps are carried out for each semiconductor chip:

either: with the wafer table 4 providing the semiconductor chip 2 at a predetermined location;

removing the provided semiconductor chip 2 with the pickup head 6 of the flip apparatus 5 and twisting the semiconductor chip 2 by 180° in order to provide the semiconductor chip 2 as a flip chip 3;

or: providing the semiconductor chip 2 as a flip chip with a feeding device;

with the transport head 8 receiving the flip chip 3 from the pickup head 6 or the feeding device;

filling the cavity 18, which is arranged in the plate 17 and formed with a transparent base, with fluxing agent, wherein the plate 17 is either arranged in a stationary manner or is moved after the filling of the cavity 18 so that the cavity 18 is situated above the first camera 14 in both cases;

depositing the flip chip 3 in the cavity 18, wherein the bumps 1 face the base of the cavity 18;

recording an image of the flip chip 3 with the first camera 14 and determining an actual position of the flip chip 3 with respect to a machine coordinate system of the bonding head 10 on the basis of the image and the first geometry data;

removing the flip chip 3 from the cavity 18 by the bonding head 10;

determining an actual position of the substrate location with respect to the machine coordinate system of the bonding head 10 either by:

moving the bonding head 10 to a position above the substrate location in which the substrate location is in the field of vision of the second camera 15, recording at least one image by means of the second camera 15, and calculating the actual position of the substrate location on the basis of the substrate location in the at least one image and the second geometry data;

or by:

calculating the actual position of the substrate location by means of actual positions of at least two substrate markings, wherein the actual position of each of the at least two substrate markings is respectively determined after the feeding of a new substrate 11 to the support 12 by:

moving the bonding head 10 to a position above the substrate 11 in which the substrate marking is in the field of vision of the second camera 15, recording an image with the second camera 15, and determining the actual position of the substrate marking by means of the image and the second geometry data; and calculating the position to be accessed by the bonding head 10 on the basis of the determined actual position of the flip chip 3 and the determined actual position of the substrate location; and moving the bonding head 10 to the calculated position and placing the flip chip 3 on the substrate location.

The fitting of the apparatus with the transport head 8, which receives the flip chip 3 from the pickup head 6 or the feeding device and places said chip in the cavity 18, and with the bonding head 10, which removes the flip chip 3 from the cavity 18 and places said chip on the substrate 11, allows an increase in the throughput of the apparatus because the transport head 8 and the bonding head 10 are able to operate substantially simultaneously, i.e. in parallel. The control device is set up to control the movements of the transport head 8 and the bonding head 10 in such a way that the two heads are at least partly simultaneously in motion without colliding with each other. With respect to the highest possible throughput of the apparatus, the control device is especially programmed to control the sequence of the individual steps of the method in such a way that the transport head 8 places the next following flip chip 3 in the cavity 18 as rapidly as possible on the basis of the duration of the individual process steps once the bonding head 10 has removed the next flip chip 3 to be mounted from the cavity 18.

FIG. 1 shows the apparatus at a point in time in which the pickup head 6 of the flip apparatus 5 has taken a semiconductor chip 2 from the wafer table 4, a flip chip 3 has been placed in the cavity 18, and the bonding head 10 transports a flip chip 3 wetted with fluxing agent to the substrate 11.

The image of the flip chip 3 which is recorded by the first camera 14 can also be used to check in addition to the determination of the actual position of the flip chip 3 whether all bumps 1 are present and/or correctly wetted. In addition, the first camera 14 can record one image after the other of the flip chip 3, the image processing software can evaluate the image and check whether all bumps 1 have been wetted correctly, and once this is the case a message can be issued that the bonding head 10 shall remove the flip chip 3 immediately from the cavity 18 and place it on the substrate location.

If the angle of vision of the second camera 15 is relatively small so that the entire substrate location does not fit into the image, the bonding head 10 is advantageously moved to different positions and an image is recorded at each position which contains a portion of the substrate location. The position and orientation of the substrate location are then determined on the basis of these images.

In a first production mode, the position of the substrate location on which the flip chip is to be positioned is determined on the basis of at least one image of the substrate location. In a second production mode, its position is determined once on the basis of substrate markings after feeding a new substrate and the individual target positions of the flip chip are then calculated by means of geometric material data. Such an application is the "wafer level packaging" (WLB), in which the substrate is a wafer on which plastic is cast. The wafer does not contain any position markings of the individual substrate locations, but substrate markings which are attached close to the edge of the wafer.

In order to exclude positioning errors of the flip chip 3 on the substrate location which are caused by changes in temperature, the position of the first optical marking 22 is determined in the calibration phase and is updated at one or several predetermined points in time by:

moving the bonding head 10 to a position in which the first optical marking 22 is in the field of vision of the second camera 15;

recording an image with the second camera 15;

determining the position of the first optical marking 22 on the basis of the image and the second geometry data; and storing the determined position as the new position of the first optical marking 22.

If the optical marking(s) is/are covered by the plate 17 when the cavity 18 of the plate 17 is situated in the position above the first camera 14, the method further comprises moving the plate 17 to a position in which the optical marking(s) 22, 23 is/are exposed before the position(s) of the optical marking(s) 22, 23 is/are updated.

The invention thus makes use of the finding that one or several optical markings which are attached to the camera support 16, to which the first camera 14 is fixed, are sufficient to reduce the influence of changes between the pixel coordinate system of the first camera 14, the pixel coordinate system of the second camera 15 and the machine coordinate system of the bonding head 10 on the positioning of the flip chip 3 on the substrate location to a level which meets current requirements.

If one or several further optical markings are present, e.g. the optical marking 23, the position of the further optical marking(s) is determined in a similar manner in the calibration phase and updated at the aforementioned points in time.

Advantageously, two pick-and-place systems are provided, which each comprise a flip apparatus 5 with a pickup head 6, a first transport system 7 with a transport head 8, a second transport system 9 with a bonding head 10, a device 13 for wetting a flip chip with a fluxing agent, and a first camera 14 and a second camera 15, which systems collect in an alternating manner a semiconductor chip 2 from the wafer table 4 and in an alternating manner mount it as a flip chip 3 on the substrate 11 provided on the support 12.

The method in accordance with the invention offers the following advantages:

The placing of the flip chip in the cavity at the same location as the removal of the flip chip from the cavity ensures that the distribution of the fluxing agent in the cavity is not changed by movements of the cavity from a first location to a second location, and that the flip chip is not displaced in the cavity, which could have a negative effect on the wetting of the bumps of the flip chip or could lead to a reduction in the throughput of the apparatus.

The duration during which the bumps of the flip chip are immersed in the fluxing agent can be adjusted independently of the other process steps. This is important in order to achieve optimal wetting of the bumps of the flip chip on the one hand and to achieve the highest possible throughput on the other hand.

The fitting with transport head and bonding head and the simultaneous, parallel operation of transport head and bonding head increase the throughput of the apparatus.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. A method for mounting semiconductor chips provided with bumps on substrate locations of a substrate, in which in a calibration phase first and second geometry data are determined and in a mounting phase the following steps are carried out for each semiconductor chip:

either: with a wafer table providing the semiconductor chip at a predetermined location;

with a pickup head of a flip apparatus removing the provided semiconductor chip and twisting the semiconductor chip by 180° in order to provide the semiconductor chip as a flip chip;

or: with a feeding device providing the semiconductor chip as a flip chip;

with a transport head receiving the flip chip from the pickup head or the feeding device;

filling a cavity, which is arranged in a plate and formed with a transparent base, with fluxing agent, wherein the plate is either arranged in a stationary manner or is moved after the filling of the cavity so that the cavity is situated in both cases above a first camera, which is arranged in a stationary manner;

depositing the flip chip in the cavity, wherein the bumps face the base of the cavity;

recording an image of the flip chip with the first camera and determining an actual position of the flip chip with respect to a machine coordinate system of a bonding head on the basis of the image and the first geometry data;

removing the flip chip from the cavity with the bonding head;

determining an actual position of the substrate location with respect to the machine coordinate system of the bonding head by means of a second camera which is fastened to the bonding head, either by:
  moving the bonding head to a position above the substrate location in which the substrate location is in the field of vision of the second camera,
  recording at least one image with the second camera, and
  calculating the actual position of the substrate location on the basis of the position of the substrate location in the at least one image and the second geometry data;
or by:
  calculating the actual position of the substrate location by means of actual positions of at least two substrate markings, wherein the actual position of each of the at least two substrate markings is determined after the feeding of a new substrate to the support by:
  moving the bonding head to a position above the substrate in which the substrate marking is in the field of vision of the second camera,
  recording an image with the second camera, and
  determining the actual position of the substrate marking by means of the image and the second geometry data; and
calculating the position to be accessed by the bonding head on the basis of the determined actual position of the flip chip and the determined actual position of the substrate location; and
moving the bonding head to the calculated position and placing the flip chip on the substrate location, wherein the transport head and the bonding head are at least partly simultaneously in motion.

2. The method according to claim 1, in which the first geometry data comprise a position of a first optical marking and a first fixed vector, which designates a direction of the first optical marking to and a distance from a reference point of a pixel coordinate system of the first camera, and in which the position of the first optical marking is updated at least at one predetermined point in time by:
  moving the bonding head to a position in which the first optical marking is in the field of vision of the second camera;
  recording an image with the second camera;
  determining the position of the first optical marking on the basis of the image and the second geometry data; and
  storing the determined position as new position of the first optical marking.

3. The method according to claim 2, in which the first geometry data comprise a position of at least one further optical marking and a further fixed vector, which designates a direction of the further optical marking to and a distance from the reference point of the pixel coordinate system of the first camera, and in which the position of the further optical marking is updated by:
  moving the bonding head to a position in which the further optical marking is in the field of vision of the second camera;
  recording an image with the second camera;
  determining the position of the further optical marking on the basis of the image and the second geometry data; and
  storing the determined position as new position of the further optical marking.

4. The method according to claim 2, in which the optical marking(s) is/are covered by the plate when the cavity of the plate is situated in the position above the first camera, the method further comprising moving the plate to a position in which the optical marking(s) is/are exposed before the position(s) of the optical marking(s) is/are updated.

5. The method according to claim 3, in which the optical marking(s) is/are covered by the plate when the cavity of the plate is situated in the position above the first camera, the method further comprising moving the plate to a position in which the optical marking(s) is/are exposed before the position(s) of the optical marking(s) is/are updated.

* * * * *